(12) United States Patent
Chen

(10) Patent No.: US 6,618,269 B2
(45) Date of Patent: Sep. 9, 2003

(54) DISCRETE CIRCUIT COMPONENT AND PROCESS OF FABRICATION

(75) Inventor: Wen Long Chen, San Shya (TW)

(73) Assignee: Comchip Technology Co., Ltd., Taipei (TW)

( * ) Notice: Subject to any disclaimer, the term of this patent is extended or adjusted under 35 U.S.C. 154(b) by 0 days.

(21) Appl. No.: 09/950,856

(22) Filed: Sep. 10, 2001

(65) Prior Publication Data

US 2002/0162686 A1 Nov. 7, 2002

(30) Foreign Application Priority Data

May 3, 2001 (TW) .................................. 90110661 A

(51) Int. Cl.⁷ .............................. H05K 1/11; H05K 1/14
(52) U.S. Cl. ..................... 361/793; 361/764; 361/790; 361/803; 438/458
(58) Field of Search ..................... 361/760–767, 361/777, 770, 790, 792, 793, 795, 803, 809, 301.4, 313; 174/52.4, 257; 438/455, 458

(56) References Cited

U.S. PATENT DOCUMENTS

| 6,021,050 A | * | 2/2000 | Ehman et al. | 361/793 |
| 6,055,151 A | * | 4/2000 | Tormey et al. | 361/313 |
| 6,373,714 B1 | * | 4/2002 | Kudoh et al. | 361/760 |

* cited by examiner

Primary Examiner—Kamand Cuneo
Assistant Examiner—Tuan Dinh
(74) Attorney, Agent, or Firm—Baker & McKenzie, Taipei; Anna Y. Tsang; John G. Flaim

(57) ABSTRACT

A discrete circuit component comprises a circuit component die having a first electrode and a second electrode. A surface of a first substrate has an electrically-conductive trace electrically connected to the first electrode of the circuit component die, and a surface of a second substrate also has an electrically-conductive trace electrically connected to the second electrode of the circuit component die. A first terminal electrode is electrically connected to the conductive trace of the first substrate, surface of the first terminal electrode is orthogonal to the longitudinal axis of the conductive trace of the first substrate. A second terminal electrode is electrically connected to the conductive trace of the second substrate, and surface of the second terminal electrode is orthogonal to the longitudinal axis of the conductive trace of the second substrate. The first and second substrates are parallel to each other and encloses the circuit component die. The conductive trace of the first substrate leads away from the circuit component die in the direction opposite to the direction in which the conductive trace of the second substrate leads away from the circuit component die. The space between the first and second substrates not being occupied by the circuit component die is filled with a material the same as the material for the first and second substrates. The filled material encloses the circuit component die completely.

30 Claims, 5 Drawing Sheets

DISCRETE CIRCUIT COMPONENT AND PROCESS OF FABRICATION

FIELD OF THE INVENTION

The present invention relates in general to a discrete circuit component and the corresponding process of its manufacturing. In particular, the present invention relates to a discrete circuit component for electronic circuits and its process of manufacturing that is particularly suitable for automated mass production.

BACKGROUND OF THE INVENTION

Active and passive discrete circuit components such as diodes, transistors, resistors and capacitors are widely used for the construction of electronic circuits. Regardless of either signal or power, linear or digital applications, different types of discrete circuit components are essential for the construction of various electronic circuit systems. Along with their counterparts fabricated inside integrated circuit (IC) devices, diodes, resistors and capacitors in the form of discrete circuit components are produced and consumed in great quantities.

Due to the low unit prices and the large quantity used, fabrication of these discrete circuit components is particularly suitable for and, practically, requires automated mass production. Without automated mass production to achieve low price and fast production rates, these discrete products cannot be competitive commercially.

Circuit components of the discrete type are available in many different packages, among which the leaded package is one of the most common. With the constantly-pursued goal of miniaturization, discrete circuit components produced to the standard of SMT (Surface-Mount Technology) have become the indispensable components in modem electronics industry for the production of almost all sorts of electronic devices, regardless of whether or not they are of miniaturized designs. However, as is well known in the art, the manufacture of many of these discrete circuit components still relies on human labor to certain extent. For example, some discrete diodes are manufactured with high level of human labor in some of its production procedural steps.

On the other hand, some conventional automated production methods for certain discrete circuit components employ the robotic pick-and-place maneuvering that mimics human actions in one or more production procedural steps. Although equipments such as pick-and-place machines indeed reduce the level of human intervention in the manufacturing process of discrete circuit components, however, due to the fact that robotic pick-and-place is only capable of handling one element of the circuit component at a time, it frequently constitutes serious bottleneck in the flow of a manufacturing process.

SUMMARY OF THE INVENTION

It is therefore an object of the invention to provide a discrete circuit component and its process of manufacture so that the component is compatible to the EIA standard chip dimensions and suitable for SMD (Surface-Mount Devices) circuit designs.

In order to achieve the above-identified object, the present invention provides a discrete circuit component that comprises a circuit component die having a first electrode and a second electrode. A surface of a first substrate has an electrically-conductive trace electrically connected to the first electrode of the circuit component die, and a surface of a second substrate also has an electrically-conductive trace electrically connected to the second electrode of the circuit component die. A first terminal electrode is electrically connected to the conductive trace of the first substrate, surface of the first terminal electrode is generally orthogonal to the longitudinal axis of the conductive trace of the first substrate. A second terminal electrode is electrically connected to the conductive trace of the second substrate, and surface of the second terminal electrode is also generally orthogonal to the longitudinal axis of the conductive trace of the second substrate. The first and second substrates are parallel to each other and together enclose the circuit component die. The conductive trace of the first substrate leads away from the circuit component die in the direction opposite to the direction in which the conductive trace of the second substrate leads away from the circuit component die. The space between the first and second substrates not being occupied by the circuit component die is filled with a material which is preferably the same as the material for the first and second substrates. The filled material encloses the circuit component die completely.

The present invention further provides a process for fabricating discrete circuit components comprising the steps of: (a) forming a matrix of a number of first electrically conductive traces on a first substrate; (b) placing a circuit component die on each of the first conductive traces, with a first electrode of the circuit component die electrically connected to the corresponding first conductive trace; (c) covering each of the circuit component dies with a second substrate, a surface of the second substrate having a matrix of a number of second electrically conductive traces each electrically connected to the second electrode of the corresponding one of the circuit component dies; (d) filling the spaces between the first and second substrates un-occupied by the circuit component dies with the same material as that for the first and second substrates, the filled material completely surrounding the dies and thereby forming an enclosed matrix of circuit component dies; (e) separating the enclosed matrix of circuit component dies into one-dimensional component arrays of a number of discrete circuit components; (f) covering each of the edges of the separated component arrays revealed after the separation with a layer of terminal electrode, one of two terminal electrodes for each of the component arrays being electrically connected to the first conductive traces and the other to the second conductive traces; and (g) cutting each of the component arrays into a number of individual discrete circuit components.

BRIEF DESCRIPTION OF THE DRAWINGS

Other objects, features, and advantages of this invention will become apparent by way of the following detailed description of the preferred but non-limiting embodiments. The description is made with reference to the accompanying drawings in which.

DETAILED DESCRIPTION OF THE INVENTION

FIGS. 1 to 9 respectively illustrate a discrete circuit component in various views in selected process steps of fabrication in accordance with a preferred embodiment of the invention. Each view illustrates the intermediate structural configuration of the inventive discrete component of the invention as it is progressively constructed in the procedural steps of the process of the invention. In the following paragraphs, a process for the fabrication of the discrete component of the invention is described with reference to these drawings.

Figure 1:
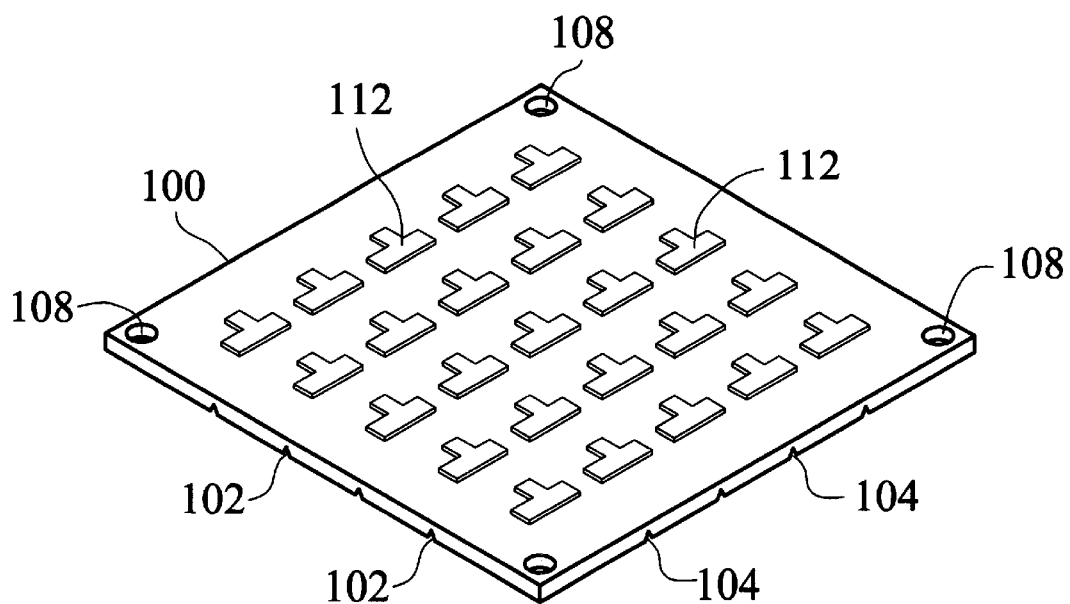
FIG. 1 is a perspective view of a substrate for the discrete components of the invention illustrating the formation of conductive traces over the surface thereof.

FIG. 1 shows that a large substrate is used as the basis on which discrete circuit components of the invention can be fabricated. It should be noted that, in the early stage of the fabrication process, the substrate 100, in its entirety, serves as the basis for a number of circuit components, not just a single one. These many circuit components are formed progressively on the substrate as the fabrication process develops. At the beginning of the fabrication process, circuit components, in general, are aligned in an orderly manner over a large area on the surface of the substrate in, for example, a two-dimensional matrix. Each individual circuit component is separated from others only at the late stage of the manufacturing process by cutting the substrate 100.

Figure 2:
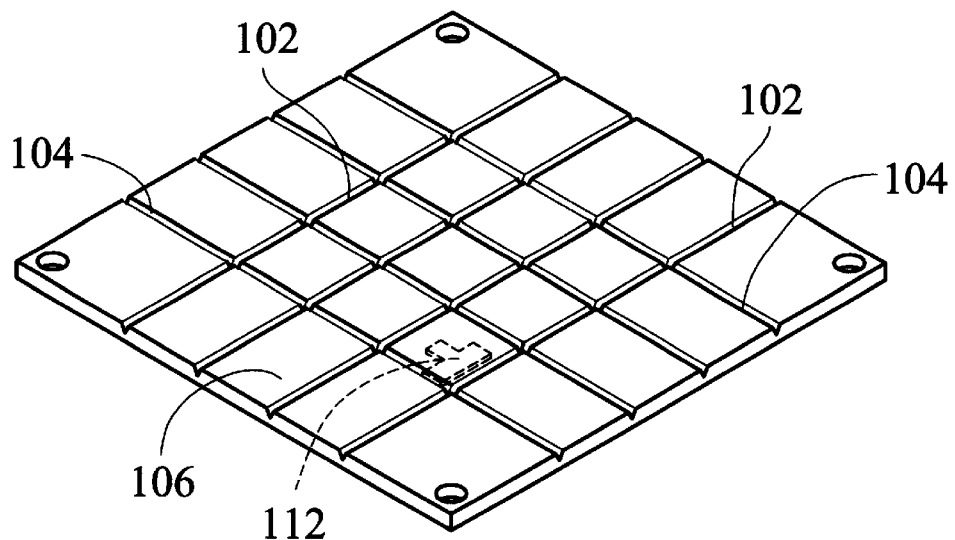
FIG. 2 is another perspective view of the substrate of FIG. 1 showing the orthogonal grooves cutting into the surface of the substrate.

In a preferred embodiment, the substrate 100 can be made using suitable material by applicable method of, for example, molding. As is illustrated in FIG. 1, electrically conductive traces 112 for the circuit components are first formed on one surface of the substrate 100. FIG. 2 is a view from another perspective that shows other details of the substrate 100 of FIG. 1 from a different observation angle. As is seen, orthogonal grooves 102 and 104, formed with suitable means, cut into the surface of the substrate 100 opposite to the surface on which the conductive traces 112 of the circuit components formed. Grooves 102 and 104 may be slots having generally V-shaped cross section with sloped side walls that are cut into the surface substrate down to adequate depth. In addition to be of assistance in the separation of the individual discrete circuit components at the late stage of the inventive manufacturing process, these grooves are also advantageous in enhancing the adherence of electrical contact layers to the terminals of the circuit components. Such improved adherence prevents peeling off of the electrical contact layers from their respective terminal surfaces. Details of this will be described in the following paragraphs.

Note that the matrix of 5-by-5 components as illustrated in FIG. 1 does not necessarily imply a limitation to the scope of the disclosure of the present invention, as is comprehensible to those in the art. The same applies to the small matrix of FIG. 2, as well as in the other drawings.

Each rectangular area surrounded by the pairs of the orthogonal grooves 102 and 104, as identified by reference numeral 106 in FIG. 2, constitutes a surface area for the construction of one circuit component. For example, the component conductive trace 112 shown by phantom line in FIG. 2, is formed inside one such rectangular surface area. All the rectangular surface areas are aligned orderly, and preferably, in a two-dimensional rectangular matrix.

Surface of the substrate 100, as noted above, is used as the basis for supporting, not just one, but a number of circuit components aligned in a two-dimensional matrix in the inventive process of fabrication. The component conductive traces 112 can be formed directly on the surface of the substrate 100 utilizing, for example, the screen printing technique. The screen-print paste used may be one containing silver, copper, or copper alloy. In other words, silver paste, copper paste and copper-alloy paste are all applicable. The printed paste may then be cured in a baking process to form the traces 112. Note, as is comprehensible for those skilled in the art, that conductive traces 112 can also be formed utilizing other techniques other than screen-printing. For example, techniques such as sputtering and coating are equally applicable.

Silver-based pastes, in general, are advantageous for forming conductive traces with excellent electrical conductivity. Of course, as is appreciable, pastes containing other metal(s) may also be suitable under different circumstances. Composition of the metal-containing paste should be selected to yield a strong bond after thermal curing that it is entrenched sufficiently deep into the interfacing area between the component conductive trace 112 and the substrate 100. Such tight integration prevents premature separation between the two, namely, the phenomenon of the trace peeling off from the substrate, due to factors such as stress induced by temperature, humidity, and/or mechanical stress fluctuations that are substantially inevitable in the process of fabrication.

It should also be noticed that, a number of positioning holes 108 can be formed near the edges of the substrate 100. These positioning holes 108 can be used for positioning and alignment of the substrate 100 at different stages of the inventive manufacturing process. For example, in case the conductive traces 112 are formed by screen-printing, the positioning holes 108 can be cooperating with a fixture installed to the screen-printing machine to provide accurate placement of the substrate 100. Precision placement of the substrate 100 ensures the correct positioning of the screen-printed traces 112 on the surface of the substrate 100.

Figure 3:
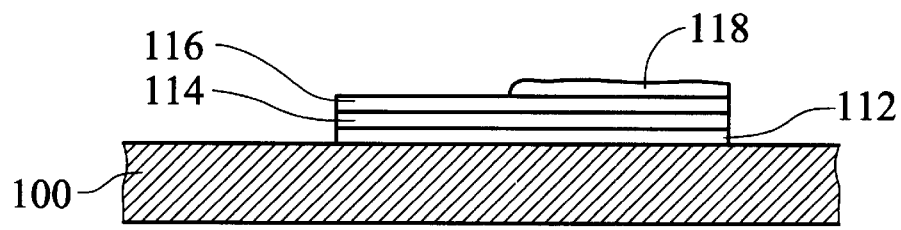
FIG. 3 is a cross-sectional view of the substrate, illustrating the coating of the conductive traces formed on the surface of the substrate.

Then, as is illustrated in FIG. 3, in a preferred embodiment of the invention, a nickel layer 114 first and a gold layer 116 follows are subsequently formed on top of each of the conductive traces 112. FIG. 3 is a cross-sectional view illustrating the component structure at this stage in cross section as taken along a plane perpendicular to the surface of the substrate 100 that passes through the symmetrical longitudinal axis of one of the traces 112. Nickel layer 114 and gold layer 116 can be formed subsequently by, for example, electroplating after the conductive trace 112 is formed. In a preferred embodiment, the nickel layer 114 and the gold layer 116 serve to provide adequate bonding between the conductive trace 112 and the component die, which is to be placed subsequently. However, as is comprehensible for those in the art, more or less metal layers can be used under different circumstances. Also, layers other than nickel and gold are also possible.

Then, after the formation of the nickel layer 114 and the gold layer 116, which cover and contact the conductive trace 112, a circuit component die is ready for placement and be electrically connected to the trace 112. As is illustrated in FIG. 3, surface of the gold layer 116 can be coated with a layer of the metal-containing paste 118. The electrically-conductive paste 118 may, for example, be the same as the silver paste used to make the conductive trace 112 and may, for example, be coated to the surface of the gold layer 116 using the same screen-printing technique described above. However, it should be noted that this layer of paste 118 is not cured at this stage. Its curing will be effected in a subsequent step of the inventive manufacturing process to be described in the following paragraphs.

Figure 4:
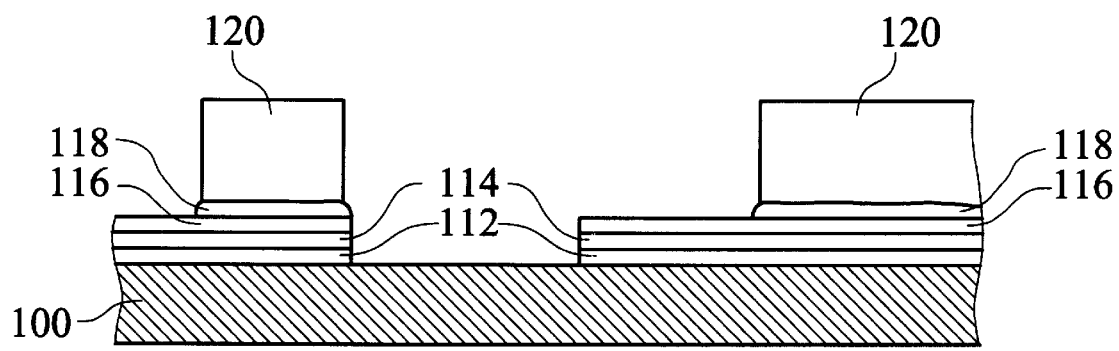
FIG. 4 is a cross-sectional view of the substrate of FIG. 3, illustrating the subsequent aligned-placement of the die of a circuit component.

In the following fabrication procedural step, as is illustrated in the cross-sectional view of FIG. 4, the discrete circuit component dies 120 are placed on the substrate 100 with the correct orientation. The placement of the multiple dies 120 on the substrate 100 at their respective locations into the aligned matrix may be achieved in a single placement operational step as a whole. When the die placement step is concluded, bottom surface of the component dies 120 is substantially glued to the substrate 100 due to the adhesiveness of the un-cured paste 118. The temporary adherence of the dies to the substrate is strong enough to prevent undesirable die shifts with respect to the substrate that lead to un-alignment due to factors such as vibration and shake in the subsequent fabrication process steps.

As is comprehensible, for certain discrete circuit components such as diodes and capacitors with terminal polarity, the polarized terminal of the die 120 to be adhered to the coated paste layer 118 can either be the positive or the negative terminal. Regardless of the polarity to adhere, it is preferable that all dies placed on the substrate be aligned to the same polarity orientation. Such is for considerations such as color coding to reveal the correct component polarity in the later phase of component production.

It should be noted that a component die aligning system, a machine used to place an entire matrix of dies onto the substrate surface in one fabrication process step can be employed to place the dies in bulk as mentioned above. Such a system may be one based on the principle of mechanical vibration to achieve simultaneous positioning and polarity alignment of all the dies on the substrate. When compared to certain conventional approaches that employ the die bonding technique, which relies on the robotic pick-and-place maneuvering to handle the placement of one component die at a time, the processing of simultaneous positioning and alignment of an entire matrix of component dies as employed by the invention is able to achieve much faster production rate (measured in UPH, units per hour). In addition, die-bonding equipments are not only much more expansive to install, the bonding wires required are also the cause for increased material costs. Further, the relatively slower pace of pick-and-place machinery is frequently the cause for production bottlenecks.

Figure 5:
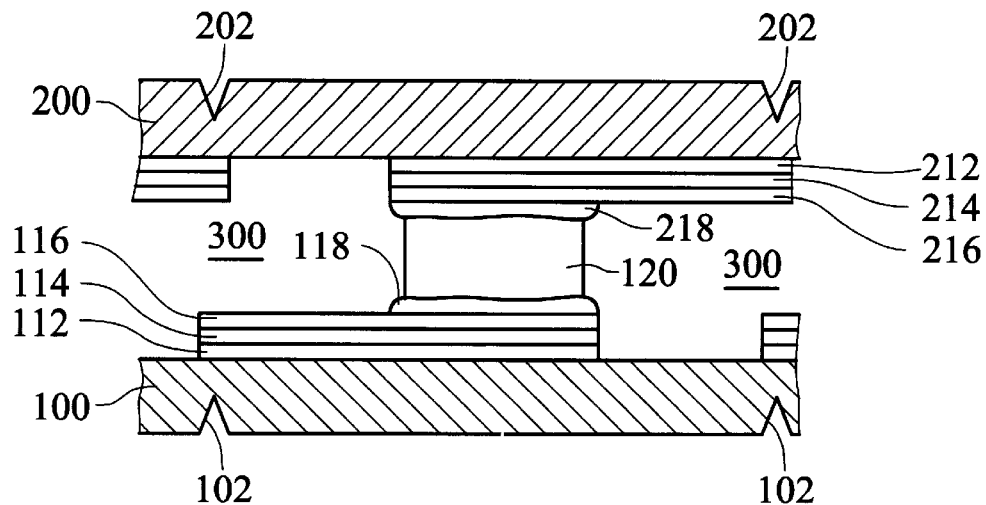
FIG. 5 is a cross-sectional view illustrating the sealing of the component die of FIG. 4 by a second substrate.

After the entire matrix of the circuit component dies 120 are positioned and aligned correctly in their respective designated locations as illustrate in FIG. 4 and glued subsequently by the electrically-conductive paste 118 as illustrated in FIG. 5, a second substrate 200 may then be assembled. Composition and structure of the second substrate 200 can, and should preferably, be similar or the same as that of substrate 100 in order to reduce sophistication of the entire inventive manufacturing process. For example, if the second substrate 200 is identical to the first 100, then it can be integrated easily with the extending terminal of its conductive traces 212 pointing to the direction opposite to that of traces 112 of substrate 100.

Apparently, as is comprehensible, the integration of the second substrate 200 needs to be conducted with sufficient positioning accuracy. This is to ensure the proper alignment of the second terminal of each of the dies 120, i.e. the top portion of the die 120 shown in FIG. 5, to the corresponding conductive trace 212 on the bottom surface of the substrate 200 already coated with electrically conductive paste 218. Naturally, also as is comprehensible, this proper positioning can be conveniently achieved utilizing a fixture that matches the positioning holes formed at the edges of both the first and second substrates.

Figure 6:
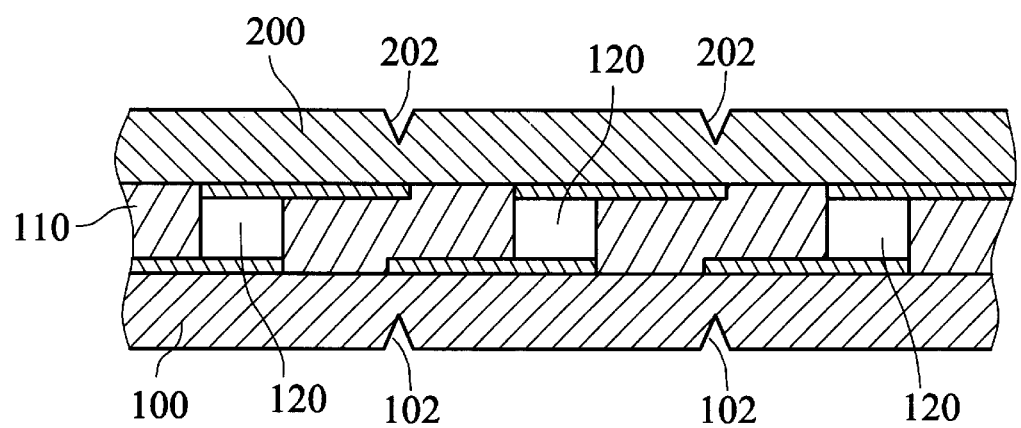
FIG. 6 is a cross-sectional view illustrating the filling by a sealing material of the space between the two substrates not occupied by the component die.

As is illustrated in FIG. 6, with a selected material, the subsequent fabrication procedural step in the inventive process then fills the empty space 300 enclosed between the first and the second substrates 100 and 200 respectively. This can be accomplished, for example, by pressure-driving a viscous material that is same as that used for making the substrates 100 and 200 into the space 300 as the substrates are supported by a mold system. In a preferred embodiment, if the filling material 310 is identical to that used for making the first and second substrates, it is possible to integrated the fill seamlessly with the two substrates after a thermal process. This packaging process can enclose the component circuit dies completely in a protective envelope. Such enclosure not only protects the components against unfavorable environmental conditions such as humidity and/or corrosive gases in the environment of future field applications, it also enhances the mechanical strength of each of the discrete components after they are cut and separated into individual units.

Figure 7:
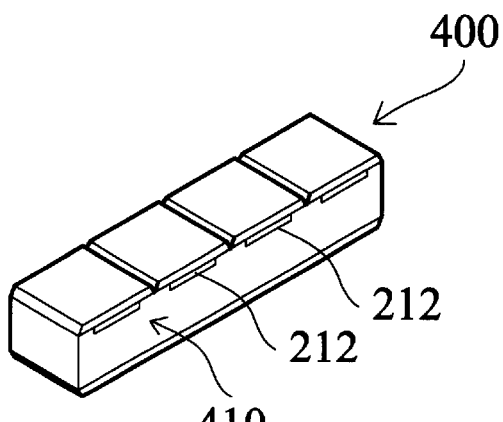
FIG. 7 is a perspective view showing an array of circuit components that is cut off from the two-dimensional matrix.

When the packaging process concludes as described in FIG. 6, the entire structure sandwiched between the first and second substrates 100 and 200 respectively that contains an entire matrix of circuit component dies can then be separated into long stripes each containing an array of packaged circuit component dies, as is illustrated in FIG. 7. This separation may be achieved along the V-shaped grooves 102 and 202 as illustrated in FIG. 6. As is comprehensible, the separation of each of the stripes can be achieved in various suitable approaches. For example, the strips can be simply broke apart due to the existence of the grooves. Or, cutting utilizing a suitable tool along the grooves are also possible. In the case that the strips are mechanically broken apart, the coarse separation surfaces are advantageous for the subsequent formation of the contact terminals.

Orientation of the separation edges for this first separation, in general, should be selected so that they are orthogonal to the longitudinal orientation of the conductive traces 112 and 212 on the first and second substrates 100 and 200 respectively. In this manner, ends of the conductive traces 112 and 212 can be exposed on the separation edge surfaces 410 on the one-dimensional component array 400. The perspective view of FIG. 7 reveals only one conductive trace 212 of the two for each of the discrete components.

Figure 8:
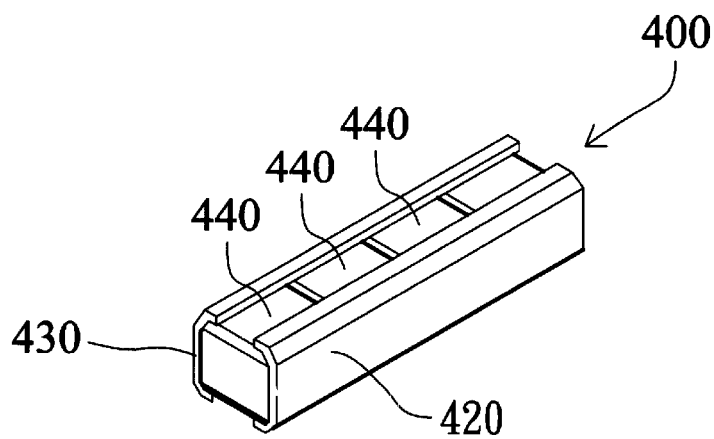
FIG. 8 is a perspective view showing the coating of the terminal electrode layer along the longitudinal direction of the cut array of FIG. 7.

Then, as is illustrated in FIG. 8, a subsequent step in the inventive manufacturing process forms the terminal electrodes 420 and 430 for the component array 400 separated in FIG. 7. Each of the terminal electrodes 420 and 430 can be formed of a metallic material with good electrical conductivity. They can be made of the similar or identical material for the conductive traces 112 and/or 212. In a preferred embodiment, the terminal electrodes 420 and 430 can be made by first printing with or dipping in the same silver paste material for making traces 112 and 212 and then curing thermally in a baking process. Other techniques such as sputtering and coating for the formation of the terminal electrodes, as is well known to those in the art, are equally applicable.

Figure 9:
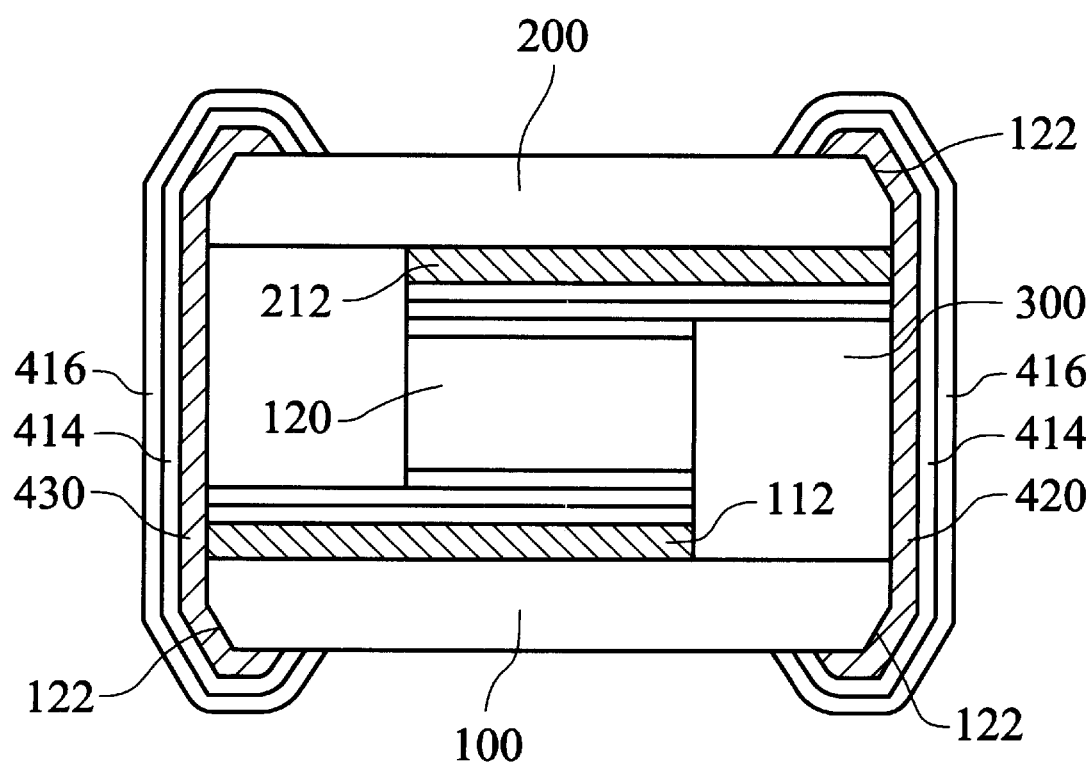
FIG. 9 is a cross-sectional view showing the structural configuration of a discrete circuit component in accordance with a preferred embodiment of the invention.

FIG. 9 is a cross-sectional view showing the structural configuration of a discrete circuit component in accordance with a preferred embodiment of the invention. The cross-sectional view of FIG. 9 is taken along a plane perpendicular to the longitudinal axis of the one-dimensional component array 400 that passes through the symmetrical center of a component circuit die 120. The cross-sectional view of FIG. 9 clearly illustrates the substantial structural configuration of a discrete circuit component constructed in accordance with the method of the present invention. Note, as shown in the drawing, when compared to a relatively sharp-tipped corner with a 90-degree angle, the sloped surface 122 of a V-shaped groove 102 as described previously allows for the formation of a smoother corner as the component arrays 400 are separated from each other. Such a smoother corner allows for the establishment of a stronger binding between a layer of terminal electrode and its corresponding substrate 100 or 200, and also between the electrode and the filled material 310.

Similarly, a material identical to that used for the construction of the conductive traces 112, such as a paste containing silver, copper or copper alloy, is preferable for making the terminal electrodes 420 and 430. This is because, after the thermal curing procedure, the formed terminal electrode layers are able to establish strong binding with the substrates 100 and 200 and the fill 310 that are in direct contact. The thermal curing allows for the material composition to be chemically combined more evenly and into regions more deeply into the interface region among all the portions. As a result, the probability of a terminal electrode layer peeling off from the component body is reduced greatly. In addition, since the material composition of the terminal electrodes 420 and 430 are identical to that of the conductive traces 112 and 212, excellent electrical conductivity between them can be achieved.

Next, as shown in FIG. 9, a nickel layer 414 and a gold layer 416 may be formed subsequently on the surface of the terminal electrodes 420 and 430 respectively. This can be accomplished by, for example, the same electroplating process as that employed for forming layers 114 and 116 in the configuration of FIG. 3. Then, each stripe illustrated in FIG. 8, i.e. the component array 400, can be cut into separate and individual discrete circuit components.

Note that as a long array of components, the component array 400 can be cut either into a number of many discrete components 440 or into a number of arrayed discrete components each containing a predetermined number of individual components physically integrated together. This is suitable for constructing, for example, resistor or capacitor packs of the SMD type. Discrete components made into the pack style can greatly reduce the cost and time for pick-and-place operation when assembling a PCB (Printed Circuit Board) in SMD design. For example, instead of pick and then place one SMD resistor pack of ten resistors, ten pick-and-place maneuvering cycles will have to be performed if traditional single-resistor SMD devices are used.

Each of the individual discrete or arrayed circuit components produced after the cutting process can then be submitted for post processing procedures including, for example, cleaning and testing. Those components qualifying to a predetermined quality standard may then be packaged, for example, in tape reels commonly adopted for SMT components.

In a preferred embodiment, terminal electrodes 420 and 430, after subsequently coated with nickel and gold layers for example, may serve directly as the terminals for electrical connection for the discrete circuit components. As is comprehensible, nickel layer 414 and gold layer 416 subsequently formed on the surface of terminal electrodes 420 and 430 respectively can provide good soldering characteristics for surface-mounting the component onto the corresponding solder pads made on a PCB. Equally comprehensible is the fact that more or less metallic layers than the nickel 414 and the gold 416 are possible under different circumstances.

While the above is a full description of a specific embodiment of the present invention, various modifications, alternative constructions and equivalents may be used. Also, although only the general and broad term of "discrete circuit components" has been used in the above descriptive paragraphs in the description of the preferred embodiment of the present invention, it is comprehensible for those skilled in the art that any discrete component of the SMT type complying to the EIA standard are certainly applicable to the invention. These include, but not limited to, discrete components such as Zener and Schottky diodes, discrete capacitors of either polarity or non-polarity nature, discrete resistors, even certain active components such as transistors. More, the invention is not only applicable to those common 1210, 1206 and 0805 dimensions of the EIA standard components, those with even smaller dimensions that are not listed in EIA are also applicable. In fact, the invention is particularly suitable for miniaturized SMT devices. Therefore, the above description and illustrations should not be taken as limiting the scope of the present invention which is defined by the appended claims.

What is claimed is:

1. A discrete circuit component, comprising:

a circuit component die having a first electrode and a second electrode;

a first substrate, a surface of said first substrate having an electrically-conductive trace electrically connected to said first electrode of said circuit component die;

a second substrate, a surface of said second substrate having an electrically-conductive trace electrically connected to said second electrode of said circuit component die;

a first terminal electrode electrically connected to said conductive trace of said first substrate, surface of said first terminal electrode being orthogonal to the longitudinal axis of said conductive trace of said first substrate;

a second terminal electrode electrically connected to said conductive trace of said second substrate, surface of said second terminal electrode being orthogonal to the longitudinal axis of said conductive trace of said second substrate; wherein said first substrate and said second substrate being parallel to each other and enclosing said circuit component die, said conductive trace of said first substrate leading away from said circuit component die in the direction opposite to the direction in which said conductive trace of said second substrate leading away from said circuit component die, and the space between said first and said second substrate not being occupied by said circuit component die being filled with a material the same as the material for said first substrate and said second substrate, and said filled material enclosing said circuit component die completely.

2. The discrete circuit component of claim 1, wherein said electrically conductive traces on the surface of said first substrate and said second substrate are cured silver paste.

3. The discrete circuit component of claim 1, wherein said first terminal electrode and said second terminal electrode are cured silver paste.

4. The discrete circuit component of claim 1, wherein said electrically conductive traces on the surface of said first substrate and said second substrate are cured copper paste.

5. The discrete circuit component of claim 1, wherein said first terminal electrode and said second terminal electrode are cured copper paste.

6. The discrete circuit component of claim 1, wherein said electrically conductive traces on the surface of said first substrate and said second substrate are cured copper-alloy paste.

7. The discrete circuit component of claim 1, wherein said first terminal electrode and said second terminal electrode are cured copper-alloy paste.

8. The discrete circuit component of claim 1, wherein said electrically conductive traces on the surface of said first substrate and said second substrate are each further covered by a nickel layer.

9. The discrete circuit component of claim 1, wherein said first terminal electrode and said second terminal electrode are each further covered by a nickel layer.

10. The discrete circuit component of claim 1, wherein said circuit component die is a diode die.

11. The discrete circuit component of claim 1, wherein said circuit component die is a transistor die.

12. The discrete circuit component of claim 1, wherein said circuit component die is a capacitor die.

13. The discrete circuit component of claim 1, wherein said circuit component die is a resistor die.

14. The discrete circuit component of claim 8, wherein said nickel layers are each further covered by a gold layer.

15. The discrete circuit component of claim 10, wherein said nickel layers are further covered by a gold layer.

16. A process for fabricating discrete circuit components comprising the steps of:
   (a) forming a matrix of a plurality of first electrically conductive traces on a first substrate;
   (b) placing a circuit component die on each of said first conductive traces, with a first electrode of said circuit component die electrically connected to the corresponding first conductive trace;
   (c) covering each of said circuit component dies with a second substrate, a surface of said second substrate having a matrix of a plurality of second electrically conductive traces each electrically connected to the second electrode of the corresponding one of said circuit component dies;
   (d) filling the spaces between said first substrate and said second substrate un-occupied by said circuit component dies with the same material as that for said first and second substrates, said filled material completely surrounding said dies and forming an enclosed matrix of circuit component dies;
   (e) separating said enclosed matrix of circuit component dies into one-dimensional component arrays of a plurality of discrete circuit components;
   (f) covering each of the edges of said separated component arrays revealed after said separation with a layer of terminal electrode, one of two terminal electrodes for each of said component arrays being electrically connected to said first conductive traces and the other of said two terminal electrodes being electrically connected to said second conductive traces; and
   (g) cutting each of said component arrays into a plurality of individual discrete circuit components.

17. The process for fabricating discrete circuit components of claim 16, wherein said electrically conductive traces on the surface of said first substrate and said second substrate are cured silver paste.

18. The process for fabricating discrete circuit components of claim 16, wherein said terminal electrodes are cured silver paste.

19. The process for fabricating discrete circuit components of claim 16, wherein said electrically conductive traces on the surface of said first substrate and said second substrate are cured copper paste.

20. The process for fabricating discrete circuit components of claim 16, wherein said terminal electrodes are cured copper paste.

21. The process for fabricating discrete circuit components of claim 16, wherein said electrically conductive traces on the surface of said first substrate and said second substrate are cured copper-alloy paste.

22. The process for fabricating discrete circuit components of claim 16, wherein said terminal electrodes are cured copper-alloy paste.

23. The process for fabricating discrete circuit components of claim 16, wherein said electrically conductive traces on the surface of said first substrate and said second substrate are each further covered by a nickel layer.

24. The process for fabricating discrete circuit components of claim 16, wherein said terminal electrodes are each further covered by a nickel layer.

25. The process for fabricating discrete circuit components of claim 16, wherein said circuit component dies are diode dies.

26. The process for fabricating discrete circuit components of claim 16, wherein said circuit component dies are transistor dies.

27. The process for fabricating discrete circuit components of claim 16, wherein said circuit component dies are capacitor dies.

28. The process for fabricating discrete circuit components of claim 16, wherein said circuit component dies are resistor dies.

29. The process for fabricating discrete circuit components of claim 23, wherein said nickel layers are each further covered by a gold layer.

30. The process for fabricating discrete circuit components of claim 24, wherein said nickel layers are each further covered by a gold layer.

* * * * *